United States Patent
Fujita et al.

(10) Patent No.: US 6,169,401 B1
(45) Date of Patent: Jan. 2, 2001

(54) FLEXIBLE OPEN QUADRATURE HIGHPASS LADDER STRUCTURE RF SURFACE COIL IN MAGNETIC RESONANCE IMAGING

(75) Inventors: Hiroyuki Fujita, Highland Hts.; Michael Burl, Chagrin Falls; Michael A. Morich, Mentor, all of OH (US)

(73) Assignee: Picker International, Inc., Highland Heights, OH (US)

(*) Notice: Under 35 U.S.C. 154(b), the term of this patent shall be extended for 0 days.

(21) Appl. No.: 09/200,168

(22) Filed: Nov. 25, 1998

(51) Int. Cl.$^7$ .................................................. G01V 3/00
(52) U.S. Cl. .............................................. 324/318; 600/422
(58) Field of Search ..................................... 324/318, 322, 324/319, 300, 307, 309; 600/422

(56) References Cited

U.S. PATENT DOCUMENTS

| | | |
|---|---|---|
| 4,816,765 | 3/1989 | Boskamp . |
| 4,918,388 | 4/1990 | Mehdizadeh et al. . |
| 5,030,915 | 7/1991 | Boskamp . |
| 5,309,104 | 5/1994 | Frederick . |
| 5,510,714 | 4/1996 | Takahashi et al. . |
| 5,559,434 | 9/1996 | Takahashi et al. . |
| 5,578,925 | * 11/1996 | Molyneaux et al. ................. 324/318 |
| 5,898,306 | * 4/1999 | Liu et al. ............................. 324/322 |
| 6,008,649 | * 12/1999 | Boskamp et al. ..................... 324/318 |

OTHER PUBLICATIONS

A 64 MHz Half–Birdcage Resonator for Clinical Imaging:, D. Ballon et al., J. Magn. Reson. 90, 131 (1990).

"An Efficient, Highly Homogenous Radiofrequency Coil for Whole–Body NMR Imaging at 1.5T", C. Hayes et al., J Magn. Reson. 63, 622 (1985).

"A Degenerate Bandpass Ladder Network for Spine Imaging in Lateral Magnetic Fields", E. Boskamp et al., Proc. RSNA, p. 2024 (1998).

"A New Quadrature Surface RF Coil", H. Liu et al., SMRM abstracts, 1493 (1997).

"An Optimized Open Quadrature Distributed RF Surface Coil", H. Fujita et al., Proc. RSNA, p. 645 (1998).

"Theory and Design of Radio Frequency Coils in Magnetic Resonance Imaging", H. Fujita, Doctoral Thesis Chapter 4, Case Western Reserve University (1998).

* cited by examiner

*Primary Examiner*—Louis Arana
(74) *Attorney, Agent, or Firm*—Fay, Sharpe, Fagan, Minnich & McKee, LLP

(57) ABSTRACT

A magnetic imaging apparatus generates a main magnetic field longitudinally through an image region and excites magnetic resonance in selected nuclei in a patient or subject disposed in the image area. The resonating nuclei generate radio frequency magnetic resonance signals which are received by a quadrature highpass ladder surface coil (D). The highpass ladder coil includes a central leg 34 having a capacitive element $C_v$ disposed symmetrically about a midpoint 44. A like number of additional legs 30, 32, 36, 38 are disposed parallel to and symmetrically on opposite side of the central leg. Side elements 40, 42 include capacitive elements $C_A$ which interconnect adjacent ends of each of the legs. The capacitive elements are disposed symmetrically about the midpoint 44 and are selected such that the coil supports at least two intrinsic resonant modes including an odd mode 50 and an even mode 52. The even mode is sensitive to fields in the plane of the coil and the odd mode is sensitive to fields in a plane orthogonal to the coil.

19 Claims, 4 Drawing Sheets

FLEXIBLE OPEN QUADRATURE HIGHPASS LADDER STRUCTURE RF SURFACE COIL IN MAGNETIC RESONANCE IMAGING

BACKGROUND OF THE INVENTION

The present invention relates to the magnetic resonance arts. It finds particular application in conjunction with medical diagnostic imaging and will be described with reference thereto. It is to be appreciated, however, that the invention may find further application in quality control inspections, spectroscopy, and the like.

In early Magnetic Resonance Image (MRI) scanners, resonance signals were received by placing linearly polarized radio frequency (RF) coils adjacent to the surface of a patient. The linearly polarized coils received only one component of magnetic resonance signals, commonly, the component in either the horizontal or vertical direction. By contrast, the magnetic resonance signals emanating from the subject are more accurately defined by a vector which rotates in a plane, i.e. has two orthogonal components. Thus, the linearly polarized coil only received one of the two orthogonal components.

A quadrature coil, which has a circularly polarized magnetic field, receives orthogonal components of the rotating vector. A quadrature coil can support both the horizontal and vertical made current distributions. Thus, the quadrature coil extracts twice the signal power from the rotating vector than does the linearly polarized coil with the same noise. This results in a signal-to-noise ratio which is greater by the square root of two or about 41%. However, prior art quadrature coils are commonly volume coils rather than surface coils. For example, some volume quadrature coils have included two saddle coils which were rotated 90° relative to each other. The portion of the patient to be imaged is disposed within the volume defined in the interior of the saddle coils. Analogously, other coils have been utilized which define a volume around the circularly polarized region.

Others have recognized the desirability of a quadrature surface or flat coil. See, for example, U.S. Pat. No. 4,918, 388, issued Apr. 17, 1992, Mehdizadeh, et al. The Mehdizadeh surface coil includes a separate loop and butterfly coil arrangement disposed on opposite sides of a dielectric sheet. The two circuits are mutually decoupled from each other for the respective resonance modes of interest.

Integrated coil assemblies have been proposed. H. Liu, et al. reported a quadrature surface coil in the Proceedings of the International Society For Magnetic Resonance In Medicine, 1997, page 1493. That coil consisted of five uniformly spaced capacitive axial elements sandwiched between two conductive elements. Liu disclosed a symmetric lowpass coil. That is, the Liu coil detects both even currents and odd currents in the lower resonant frequencies. Modeling of such structures has shown undesirable localized electric field effects leading to coil tuning instability. This instability is due to the small capacitance values on each axial element required because of the lowpass configuration. Moreover, many capacitive elements in series were required in modeling, which is not ideal from a manufacturing view.

Another integrated coil is described by Boskamp et al. in the Proceedings of the International Society of Magnetic Resonance in medicine, 1998, page 2024. The Boskamp coil has a symmetrical degenerate bandpass configuration in which the two lowest modes occur at the same frequency. Boskamp's device is a bandpass coil, that, while more stable than a lowpass, is still not optimum. Moreover, tuning a coil according to Boskamp requires varying the capacitance of each capacitor on either the axial or horizontal element. This necessitates a time consuming, expensive tuning process depending on the desired frequency match.

Additionally, both the Liu and Boskamp devices may require use of a 180° phase shift cable (on the order of 1 meter in length) as well as inductors to match the frequency of the two desired modes.

The present invention contemplates a new, improved open quadrature highpass RF surface coil which overcomes the above difficulties and others.

BRIEF SUMMARY OF THE INVENTION

In accordance with the present invention, a magnetic resonance apparatus includes a main magnetic field generator for providing a magnetic field through an examination region. A magnetic resonance excitor is also included for exciting a nuclei of the subject in the examination region to generate magnetic resonance signals. A first radio frequency coil detects the magnetic resonance signals from the resonating nuclei of the subject. The coil includes N parallel legs, where N is an odd integer equal to or greater than 5. Electrically conductive sides interconnect ends of the legs while a plurality of side capacitive elements are electrically connected in series along each of the sides. A central one of the N legs, having at least one central leg capacitive element is also included. The side and central leg capacitive elements are symmetric about a midpoint of the central leg such that the coil supports an even mode which is sensitive to a resonance signal component in the plane of the coil and an odd mode which is sensitive to resonance signals in a plane orthogonal to the plane of the coil.

In accordance with another aspect of the present invention, the radio frequency coil further includes a sampling port electrically in parallel to at least one of the central leg capacitive elements through which the even mode is sampled.

In accordance with another aspect of the present invention, the radio frequency coil includes a sampling port electrically connected parallel to two of the side capacitive elements symmetrically about the central leg through which the odd mode is sampled.

In accordance with another aspect of the present invention, the radio frequency coil further includes the capacitive elements being selected to allow magnetic resonance signals above a pre-selected frequency to pass substantially unimpeded, while frequencies below the preselected frequency are substantially impeded such that the radio frequency coil operates in a highpass mode.

In another aspect of the present invention, a second radio frequency coil is placed partially overlapping the first radio frequency coil such that the mutual inductance therebetween is minimized.

In accordance with the present invention, a quadrature highpass ladder coil for magnetic resonance imaging includes a central leg having one or more of central leg capacitive elements. A plurality of legs without capacitive elements are included parallel to and symmetrically from each side of the central leg. Also included, are a plurality of side capacitive elements, each being electrically connected between a first adjacent end of each of the plurality of legs and between second adjacent ends of each of the plurality of legs. The legs and side capacitive elements support two frequency modes, an even mode sensitive to radio frequency fields in a plane parallel to that of the legs and an odd mode sensitive to radio frequency fields orthogonal to the plane of the legs.

In accordance with another aspect of the present invention, the side and central leg capacitive elements are selected such that the odd and even modes have peak sensitivity to a common radio frequency.

One advantage of the present invention resides in an open RF coil structure which is easy to manufacture.

Another advantage of the present invention resides in an optimized current distribution that supports both even and odd current distributions along the axial conductors.

Another advantage of the present invention resides in a highpass implementation, reducing the localized electric field effects that can lead to coil tuning instability.

Other benefits and advantages of the present invention will become apparent to those skilled in the art upon a reading and understanding of the preferred embodiment.

BRIEF DESCRIPTION OF THE DRAWINGS

The invention may take physical form in certain parts and arrangements of parts and in various steps and arrangements of steps. The drawings are only for purposes of illustrating the preferred embodiments and are not to be construed as limiting the invention.

DETAILED DESCRIPTION OF THE PREFERRED EMBODIMENTS

Figure 1:
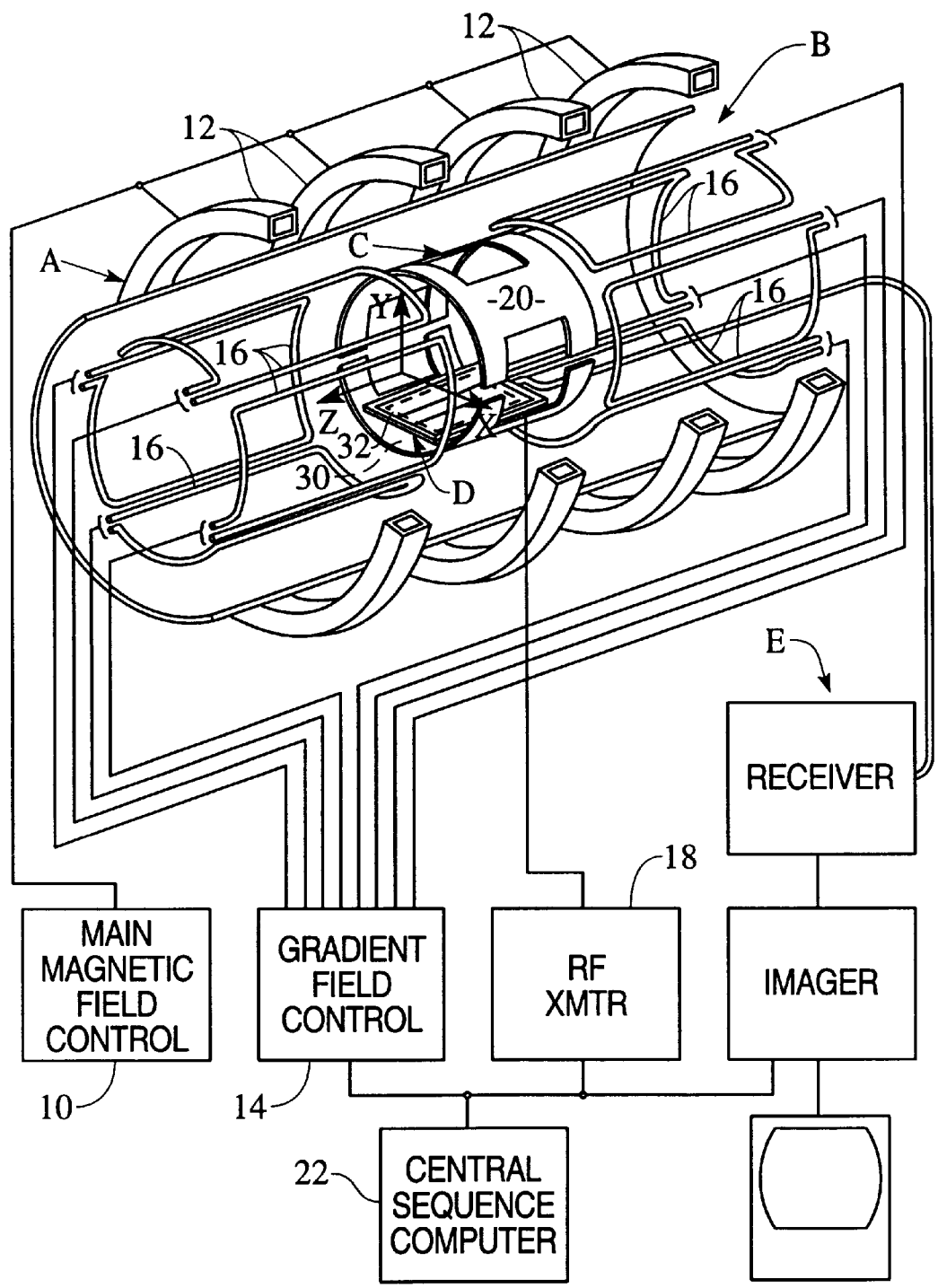
FIG. 1 is a diagrammatic illustration of a magnetic resonance imaging apparatus in accordance with the present invention.

With reference to FIG. 1, a magnetic resonance imaging apparatus includes a main magnetic field generator A for establishing a generally static, main magnetic field longitudinally through an image region along a Z axis. Gradient coils B selectively produce magnetic field gradients transversely across the main magnetic field of the image region. A magnetic resonance excitor C excites magnetic resonance in selected nuclei in a patient or subject disposed in the image area. The resonating nuclei generate radio frequency (RF) magnetic resonance signals which are received by surface coils D. More specifically, the surface coil is positioned adjacent to a preselected region of the subject to be imaged such that it receives magnetic resonance signals from the nuclei in the preselected region of interest. Electronic processing circuitry E converts the received radio frequency signals into an image representation indicative of nuclei density, relaxation time, position, nuclei characteristics and the like.

The main magnetic field generator A includes a magnetic field control circuit 10 and a plurality of high power resistive or super conducting magnets 12. A gradient magnetic control field control circuit 14 applies current pulses to gradient coils 16 to create gradients across the main magnetic field. The resonance excitor C includes a radio frequency transmitter 18 and a transmission coil 20 to broadcast RF signals that excite and manipulate the magnetic resonance. Optionally, the localized surface coil D may be connected with the RF transmitter to apply the RF pulses to adjacent regions of the subject. A central computer 22 coordinates the sequence and timing of the gradient field and RF pulses as is conventional in the art.

The magnetic resonance signals emitted by the precessing or relaxation of nuclei in the subject have components only in a plane that is normal to the direction of the static, main magnetic field. For a coordinate system in which the Z-axis extends along the main magnetic field, the magnetic resonance signals are within x-y plane, and are generally circularly polarized.

Figure 2:
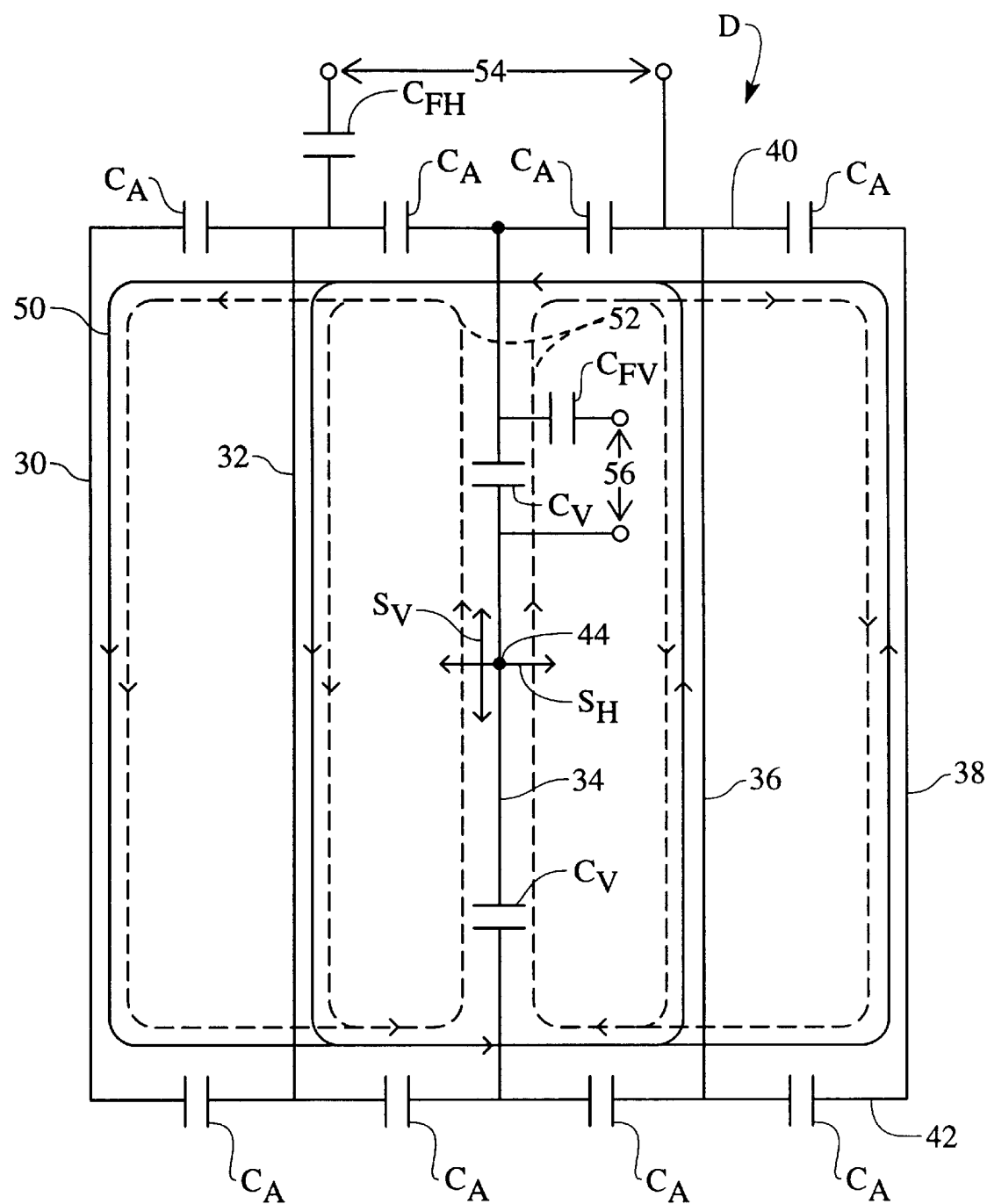
FIG. 2 is a simplified circuit diagram of an exemplary surface coil assembly in accordance with the present invention.

With reference to FIG. 2, the localized coil includes N legs, where N is an odd integer. In the preferred embodiment, there are five legs 30, 32, 34, 36, and 38. The legs are interconnected by side elements 40, 42 which are interrupted with capacitors $C_A$ between each pair of legs. The center leg, 34 in the preferred embodiment, is interrupted with a pair of capacitors $C_v$. The capacitive elements are selected such that the capacitance is symmetric about a central point 44 of the coil along a direction Sv parallel to the legs and is also symmetric about the center point in a direction $S_H$ parallel to the side conductors.

The coil supports four different intrinsic resonance modes. The two resonance modes for quadrature reception are the two highest resonant modes. Of these modes, the third or odd mode 50, and the fourth or even mode 52 are of particular interest. The odd mode is defined by currents flowing peripherally in a loop like path, but divided among the legs to either side of the central leg. The even mode is defined by two counter rotating current loops which flow in the same direction through the central leg 34 and are divided among the other legs defining the return portions of the two loops. The odd mode is responsive to magnetic fields in the direction perpendicular to the plane of FIG. 2. The even mode is responsive to fields in the plane of FIG. 2. The values of capacitances $C_A$ are selected to be not only symmetric about the center point 44, but also such that the odd mode has a resonant frequency that is the same as the resonant frequency of the imaged dipole of the system, for the hydrogen dipole in a 1.5 T magnetic field, 64 MHz. The capacitances $C_v$ and $C_A$ are selected to be not only symmetric about the center point 44, but such that the even mode has the resonant frequency of the dipole of interest.

The coil D has an output port 54 for the odd mode 50 and an output port 56 for the even mode 52. A matching capacitor $C_{FV}$ is associated with the output port 54 for the odd mode and a matching capacitor $C_{FV}$ is associated with the output port 56 for the even mode.

With continued reference to FIG. 2, it is significant that the quadrature surface coil is configured as a highpass ladder structure RF coil. The selection of the highpass mode enables selection or use of capacitive elements having capacitance values on the order of ten times greater than those we estimate are needed for a lowpass or bandpass coil. These capacitors correspondingly reduce the electric field surrounding the subject. In the surface coil shown by FIG. 2, to detect and match a resonant frequency of hydrogen, 63.7 MHZ, the capacitors $C_A$ have a capacitance of 78 pF while capacitors $C_v$ have a capacitance of 217 pF.

Figure 3:
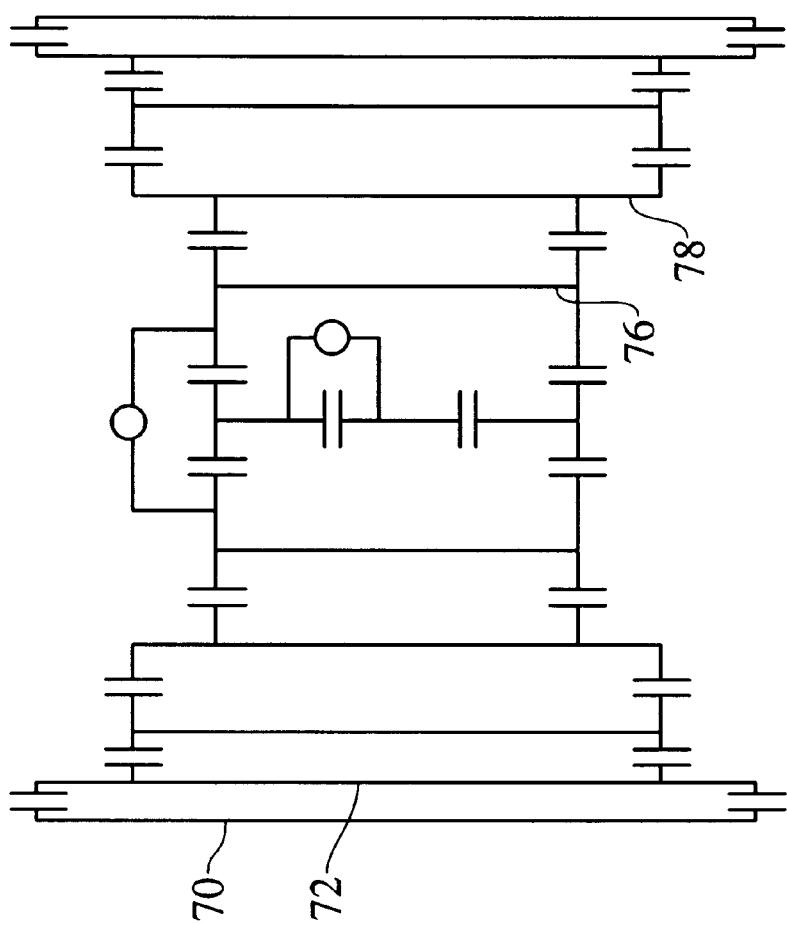
FIG. 3 is an alternate embodiment exemplifying leg elements of varying sizes and spacing.

Referring now to FIG. 3, an alternate embodiment of the surface coil depicts axial elements or legs being spaced by varying amounts from each other and having differing lengths. Again, the overall coil and its capacitive distribution are symmetric about a center point 44'. The exemplary spacing depicted is used to manipulate the odd or even current distributions in accordance with the region from which the highest signal uniformity is desired. That is, the non-uniform spacing and/or length of conductors alters the detectable current densities in the view field. Those skilled in the art will appreciate that the desired imaging region will determine the spacing and/or lengths used. For example, a coil for imaging the upper spine and neck regions.

Figure 4:
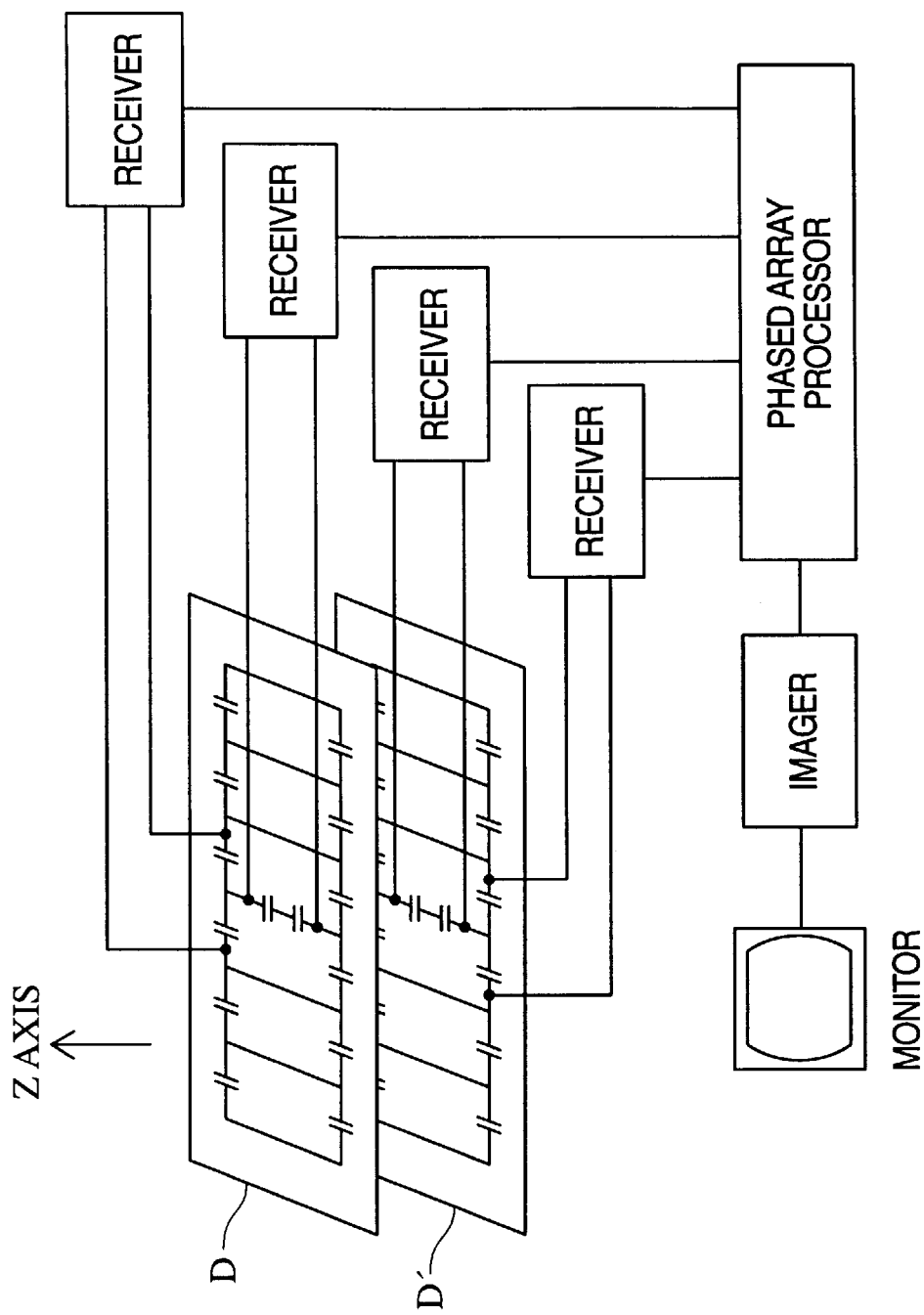
FIG. 4 is another embodiment showing a pair of surface coils together in a phased array system.

As illustrated in FIG. 4, a phased array is obtained by overlapping several surface coils D, D' along the Z axis by an amount which minimizes mutual inductance. Those skilled in the art will recognize that the multiple distributed phased array coil covers a broader imaging region and improves the signal to noise ratio as compared to a single coil covering a comparable area.

The invention has been described with reference to the preferred embodiment. Modifications and alterations will occur to other upon a reading and understanding of the preceding detailed description. It is intended that the invention be construed as including all such modifications and alterations insofar as they come within the scope of the appended claims or the equivalents thereof.

What is claimed is:

1. In a bore-type magnetic resonance apparatus which includes a main magnetic field generator for providing a magnetic field longitudinally through a bore in which an examination region is defined, a magnetic resonance excitor for exciting a nuclei of a subject in the examination region to resonate, the nuclei generating magnetic resonance signals, and a highpass transmit/receive radio frequency coil disposed in the bore for detecting the magnetic resonance signals from the resonating nuclei of the subject, the transmit/receive radio frequency coil including:
   exactly 5 parallel legs;
   8 capacitive elements located between and interconnecting ends of the 5 legs;
   a central one of the 5 legs having at least one central leg capacitive element, the side and central leg capacitive elements being symmetric about a midpoint of the central leg such that the coil supports an even resonance mode which is sensitive to a resonance signal component in the plane of the coil and an odd resonance mode which is sensitive to a resonance signal component in a plane orthogonal to the plane of the coil.

2. In a magnetic resonance apparatus which includes a main magnetic field generator, a magnetic resonance excitor for exciting a nuclei, and at least a first radio frequency coil for detecting magnetic resonance signals from the excited nuclei, the radio frequency coil including:
   N parallel legs, where N is an odd integer equal to or greater than 5;
   electrically conductive sides interconnecting ends of the legs;
   a plurality of side capacitive elements electrically connected in series along each of the sides; and
   a central one of the N legs having at least one central leg capacitive element, the side and central leg capacitive elements selected such that the coil supports an even mode which is sensitive to a resonance signal component in the plane of the coil and an odd mode which is sensitive to a resonance signal component in a plane orthogonal to the plane of the coil, the side and central leg capacitive elements being selected to allow magnetic resonance signals above a preselected frequency to pass substantially unimpeded while frequencies below the preselected frequency are substantially impeded, such that the radio frequency coil operates in a highpass mode.

3. In the magnetic resonance apparatus as set forth in claim 2, the radio frequency coil further including:
   a sampling port electrically in parallel to at least one of the central leg capacitive elements through which the even mode is sampled.

4. In the magnetic resonance apparatus as set forth in claim 3, the radio frequency coil further including:
   a sampling port connected electrically parallel to two of the side capacitive elements symmetrically about the central leg through which the odd mode is sampled.

5. In the magnetic resonance apparatus as set forth in claim 2, the radio frequency coil further including:
   the legs being spaced unevenly from each other but symmetrically about the central leg.

6. In the magnetic resonance apparatus as set forth in claim 5, the radio frequency coil further including:
   the legs being of different lengths from each other but being symmetric about a plane passing orthogonally through the midpoint of the central leg.

7. In the magnetic resonance apparatus as set forth in claim 2, the radio frequency coil further including:
   the legs being of different lengths from each other but being symmetric about a plane passing orthogonally through the midpoint of the central leg.

8. In the magnetic resonance apparatus as set forth in claim 2, further including:
   at least a second radio frequency coil placed partially overlapping the first radio frequency coil such that mutual inductance for all modes is minimized.

9. In the magnetic resonance apparatus as set forth in claim 2, wherein the electrically conductive sides of the radio frequency coil lie parallel to the magnetic field generated by the main magnetic field generator.

10. A quadrature highpass ladder coil for magnetic resonance imaging comprising:
    a central leg having at least one central leg capacitive element;
    a plurality of legs without capacitive elements disposed parallel to and symmetrically on each side of the central leg; and
    a plurality of side capacitive elements each electrically connected between first adjacent ends of each of the plurality of legs and between second adjacent ends of each of the plurality of legs,
    the central leg and side capacitive elements supporting two frequency modes, an even mode responsive to radio frequency fields in a plane of the legs and an odd mode responsive to radio frequency fields in a plane orthogonal to the plane of the legs.

11. The quadrature highpass ladder coil as set forth in claim 10 wherein the side and central leg capacitive elements being selected such that the odd and even modes have peak responsive to a common radio frequency.

12. The quadrature highpass ladder coil as set forth in claim 11 wherein the legs are irregularly spaced from each other but are symmetric relative to the central leg.

13. The quadrature highpass ladder coil as set forth in claim 10 wherein the legs have a different lengths but are symmetric about a midpoint of the central leg.

14. The quadrature highpass ladder coil as set forth in claim 10 wherein the central leg capacitive elements are symmetric about a midpoint of the central leg.

15. The quadrature highpass ladder coil as set forth in claim 10 further comprising:
    an even mode sampling port electrically connected across one of the central leg capacitive elements; and
    an odd mode sampling port electrically connected across side capacitive elements symmetrically about the central leg.

16. In a method of magnetic resonance imaging in which a temporally constant uniform magnetic field is generated through an examination region, radio frequency signals are transmitted into the examination region to induce magnetic resonance of resonating nuclei of a desired object, the induced magnetic resonance is received by a quadrature coil and processed into an image representation, wherein the coil supports at least two intrinsic resonant modes, the method comprising:

matching a highest of the two resonant modes to occur at a common frequency; and passing received signals at and above the common frequency to a receiver.

17. The method as set forth in claim 16 where the coil includes a plurality of parallel legs, ends of the parallel legs being interconnected by electrically capacitive side elements; a central one of the parallel legs having at least one central leg capacitive element wherein the matching step includes:

adjusting an effective reactance of at least one portion of the coil such that an even mode and an odd mode have peak sensitivity at the common frequency.

18. The method as set forth in claim 16, further comprising disposing the coil in the examination region such that sides of the coil are parallel to the temporally constant magnetic field.

19. The method as set forth in claim 16, wherein the coil supports four resonant modes, and the matching step comprises matching the highest two of the four resonant modes to occur at a common frequency.

* * * * *